US 6,531,970 B2

(12) United States Patent
McLaughlin et al.

(10) Patent No.: US 6,531,970 B2
(45) Date of Patent: Mar. 11, 2003

(54) DIGITAL SAMPLE RATE CONVERTERS HAVING MATCHED GROUP DELAY

(75) Inventors: Kevin J McLaughlin, Nashua, NH (US); Robert W. Adams, Acton, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/876,468

(22) Filed: Jun. 7, 2001

(65) Prior Publication Data

US 2002/0190880 A1 Dec. 19, 2002

(51) Int. Cl.[7] .......................... H03M 7/00; G06F 17/17
(52) U.S. Cl. ........................................ 341/61; 708/313
(58) Field of Search .......................... 341/61, 118, 143, 341/144; 348/449; 358/1.2; 370/545; 381/119; 708/313, 300; 710/61; 375/240.22, 377; 713/600; 327/105; 704/503

(56) References Cited

U.S. PATENT DOCUMENTS

| 5,289,116 A | * | 2/1994 | Kurita et al. ............. 324/76.11 |
| 5,448,193 A | * | 9/1995 | Baumert et al. ............ 327/156 |
| 5,475,628 A | | 12/1995 | Adams et al. |
| 5,631,931 A | * | 5/1997 | Takano et al. ............... 375/347 |
| 5,666,299 A | | 9/1997 | Adams et al. |
| 5,875,354 A | * | 2/1999 | Charlton et al. .............. 710/61 |
| 6,057,789 A | * | 5/2000 | Lin .............................. 341/61 |
| 6,141,671 A | | 10/2000 | Adams et al. |

OTHER PUBLICATIONS

Analog Devices, Inc., AD1896 Specification, 192kHz Stereo Asynchronous Sample Rate Converter, 2001, pp. 1–24.
"An Asynchronous Sample Rate Converter with 120 dB THD+N Supporting Rates up to 192 kHz", K. McLaughlin et al, AES 109th Convention, Los Angeles, Sep. 22–25, 2000, pp. 1–8.

* cited by examiner

Primary Examiner—Patrick Wamsley
(74) Attorney, Agent, or Firm—Wolf, Greenfield & Sacks, P.C.

(57) ABSTRACT

Methods and apparatus are provided for sample rate conversion in a system including two or more sample rate converters. The method includes the steps of providing an input clock and an output clock to each of the sample rate converters, measuring a sample rate ratio of the clocks in one of the sample rate converters, designated as a master, and controlling each of the sample rate converters with the sample rate ratio measured by the master. The measured sample rate ratio may be transmitted from the master to each of the other sample rate converters. This approach matches the group delays among the sample rate converters.

22 Claims, 8 Drawing Sheets

DIGITAL SAMPLE RATE CONVERTERS HAVING MATCHED GROUP DELAY

FIELD OF THE INVENTION

This invention relates to digital sample rate converters and, more particularly, to techniques for insuring matched group delay among two or more digital sample rate converters operating with one or more input clocks having the same or nearly the same frequencies and with one or more output clocks having the same or nearly the same frequencies.

BACKGROUND OF THE INVENTION

Audio recording studios commonly digitize signals produced by analog sources, such as microphones. In these studios, audio recording, production, editing and processing are performed in the digital domain. For this reason, most modern digital audio equipment is equipped to receive digital input signals and to provide digital output signals. There is, however, no established standard for a digital sampling rate. Accordingly, digital sample rate converters have been developed to permit digital interfacing between systems that operate at different sample rates.

Digital sample rate converters receive input samples at the sample rate of an input clock and provide output samples at the sample rate of an output clock. Asynchronous sample rate converters are capable of converting between any two sample rates, and the ratio of these rates may be irrational. A purpose of an asynchronous digital sample rate converter is to decouple the sampling rate of the input and output data streams from the clock frequencies used in the processing or storage of these data streams. In addition, an asynchronous sample rate converter may follow slow variations of the input and output sample rates. An asynchronous digital sample rate converter is described in U.S. Pat. No. 5,475,628, issued Dec. 12, 1995 to Adams et al; U.S. Pat. No. 5,666,299 issued Sep. 9, 1997 to Adams et al; and U.S. Pat. No. 6,141,671 issued Oct. 31, 2000 to Adams et al.

It is frequently desirable to operate two or more digital sample rate converters with one or more input clocks having the same or nearly the same frequencies and with one or more output clocks having the same or nearly the same frequencies. For example, audio applications may require the outputs of several microphones to be connected in parallel to audio recording and/or processing equipment. In such applications, multiple sample rate converters may be utilized. Each sample rate converter receives input data at a sample rate determined by an input clock and converts the input data to a sample rate determined by an output clock. The output clock sample rate can be asynchronous or synchronous with respect to the input clock sample rate.

In order to sample rate convert the input data from the input clock rate to the output clock rate, the sample rate ratio, i.e., the ratio of the input clock rate to the output clock rate, is measured by the sample rate converter. The sample rate ratio is used to adjust the length of an FIR filter that is used to prevent aliasing in the sample rate conversion. Since the sample rate ratio of the clock rates may be an irrational number, each sample rate ratio measurement may vary by one least significant bit from the previous sample rate ratio measurement. If the sample rate ratio is updated each time it is measured, the length of the FIR filter may oscillate by one least significant bit, causing distortion in the output data. To avoid such oscillations, hysteresis is introduced such that the sample rate ratio is updated only if it varies by at least two significant bits.

In a multiple sample rate converter configuration, the hysteresis produces slightly different sample rate ratio measurements in the different sample rate converters. Therefore, the lengths of the FIR filters in the different sample rate converters are slightly different as well. The group delay, which is the delay of the input data through the sample rate converter, is a function of the FIR filter length, which in turn is a function of the sample rate ratio. Thus, when the sample rate ratio varies between multiple sample rate converters, the group delay through the sample rate converters is slightly different as well. When the data being sent through the sample rate converter is linear PCM audio data, the delay differences between sample rate converters result in phase differences in the audio signals. Such phase differences reduce the fidelity of audio processing and may be unacceptable. For example phase differences may shift the location of the sound or may result in cancellation of the sound.

Accordingly, there is a need for methods and apparatus for matching the group delay between two or more digital sample rate converters.

SUMMARY OF THE INVENTION

According to a first aspect of the invention, a method is provided for operating two or more sample rate converters. The method comprises the steps of providing an input clock to each of the sample rate converters, providing an output clock to each of the sample rate converters, measuring a sample rate ratio of the clocks in one of the sample rate converters, designated as a master, and controlling each of the sample rate converters with the sample rate ratio measured by the master.

Typically, the sample rate ratio of the input clock to the output clock is measured. Depending on the system configuration, a single input clock or two or more input clocks may be used. Furthermore, a single output clock or two or more output clocks may be used.

Preferably, the measured sample rate ratio is transmitted from the master to each of the other sample rate converters. The sample rate ratio may be transmitted on an output data line of the master. Each of the sample rate converters may select an internal or an external sample rate ratio in response to a mode select input.

According to another aspect of the invention, a sample rate conversion system is provided. The sample rate conversion system comprises a master sample rate converter and one or more slave sample rate converters each adapted for receiving an input clock and an output clock. The master sample rate converter includes a sample rate ratio circuit for measuring a sample rate ratio of the clocks. The one or more slave sample rate converters each includes a sample rate conversion circuit for sample rate conversion according to the sample rate ratio measured by the master sample rate converter.

In one embodiment, the master sample rate converter and the one or more slave sample rate converters have data lines connected in a parallel configuration. In another embodiment, the master sample rate converter and the one or more slave sample rate converters have data lines connected in a daisy chain configuration.

According to a further aspect of the invention, a sample rate converter comprises a sample rate conversion circuit for converting an input signal at a sample rate of an input clock to an output signal at a sample rate of an output clock according to a sample rate ratio, a sample rate ratio circuit for measuring the sample rate ratio of the clock sample rates, and a control circuit. The control circuit supplies the sample rate ratio from the sample rate ratio circuit to the sample rate conversion circuit in a first operating mode and supplies the sample rate ratio from an external source to the sample rate conversion circuit in a second operating mode.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
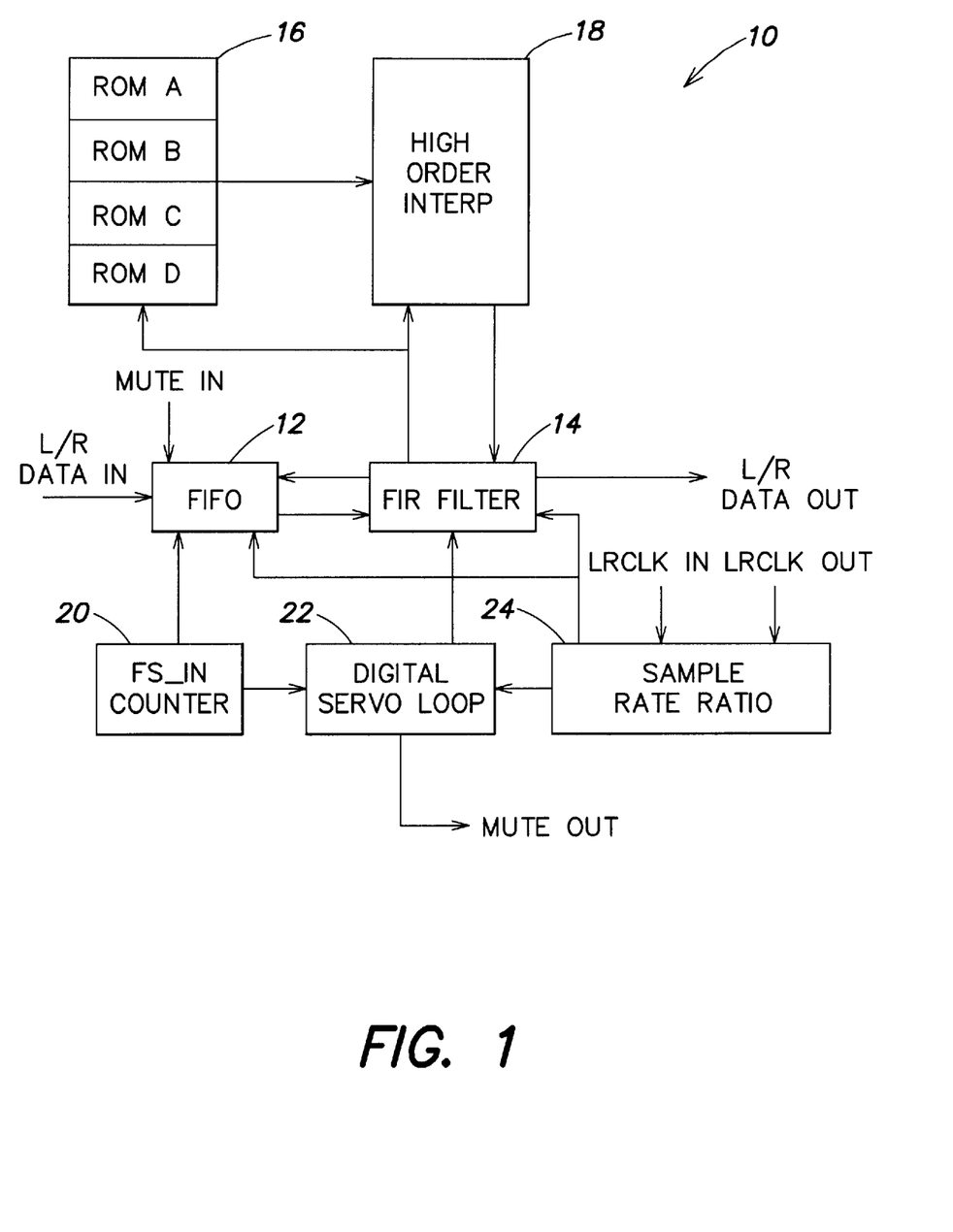
FIG. 1 is a simplified block diagram of an example of an asynchronous sample rate converter suitable for incorporating the present invention.

A simplified block diagram of an example of an asynchronous sample rate converter is shown in FIG. 1. The sample rate converter receives input data L/R DATA IN at a sample rate $F_{S\ IN}$ of an input clock LRCLK IN and supplies output data L/R DATA OUT at a sample rate $F_{S\ OUT}$ of an output clock LRCLK OUT. The sample rate ratio $F_{S\ IN}/F_{S\ OUT}$ may be an irrational number that is greater than one or less than one. The example of FIG. 1 is an audio sample rate converter which converts time multiplexed left and right channels of a stereo audio system. However, the present invention is not limited to audio applications.

As shown in FIG. 1, an asynchronous sample rate converter 10 includes a FIFO 12, an FIR filter 14, a ROM 16, a high order interpolation circuit 18, an $F_{S\ IN}$ counter 20, a digital servo loop 22 and a sample rate ratio circuit 24. The FIFO 12 adjusts the input samples and stores them for a convolution cycle of the FIR filter 14. The counter 20 provides the write address to the FIFO and a ramp input to the digital servo loop 22. The ROM 16 stores coefficients for the FIR filter 14 convolution and performs a high order interpolation between the stored coefficients. The sample rate ratio circuit 24 measures the sample rate ratio for dynamically altering the ROM coefficients and scaling of the FIR filter length, as well as the input data. The digital servo loop 22 automatically tracks the input and output sample rates and provides the FIFO and ROM start addresses for the start of the FIR filter convolution.

The sample rate ratio circuit 24 is used to dynamically alter the coefficients in the ROM 16 for the case when $F_{S\ IN}$ is greater than $F_{S\ OUT}$. The ratio is calculated by comparing the outputs of an $F_{S\ OUT}$ counter and an $F_{S\ IN}$ counter, as described below. If $F_{S\ OUT}$ is greater than $F_{S\ IN}$, the ratio is held at one. If $F_{S\ IN}$ is greater than $F_{S\ OUT}$, the sample rate ratio is updated if it is different by more than two least significant bits of the sample rate ratio measurement from the previous $F_{S\ OUT}$ to $F_{S\ IN}$ comparison. This provides some hysteresis to prevent the filter length from oscillating and causing distortion. Additional information regarding the sample rate architecture shown in FIG. 1 is provided in the AD1896 Data Sheet, Analog Devices, 2001 and in "An Asynchronous Sample Rate Converter with 120 dB THD+N Supporting Sample Rates Up to 192 KHz", K. McLaughlin et al, AES 109th Convention, Los Angeles, Sep. 22–25, 2000, which are hereby incorporated by reference.

Figure 2:
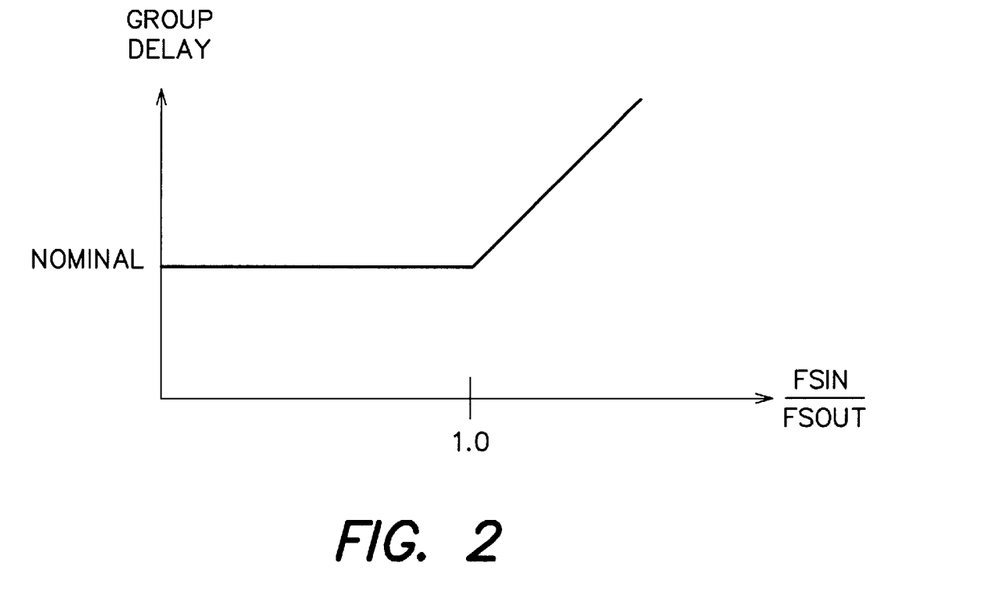
FIG. 2 is a graph of group delay through a sample rate converter as a function of sample rate ratio for an ideal case.

As noted above, the group delay of digital signals processed by the sample rate converter is a function of the sample rate ratio $F_{S\ IN}/F_{S\ OUT}$. The group delay is plotted as a function of sample rate ratio in FIG. 2 for the ideal case where the sample rate ratio is measured for a long measurement time. As illustrated, the group delay is constant for sample rate ratios less than 1.0 and increases linearly for sample rate ratios greater than 1.0. The case shown in FIG. 2 is not practical for implementation because of the long measurement time required to obtain an accurate estimate of the sample rate ratio.

Figure 3:
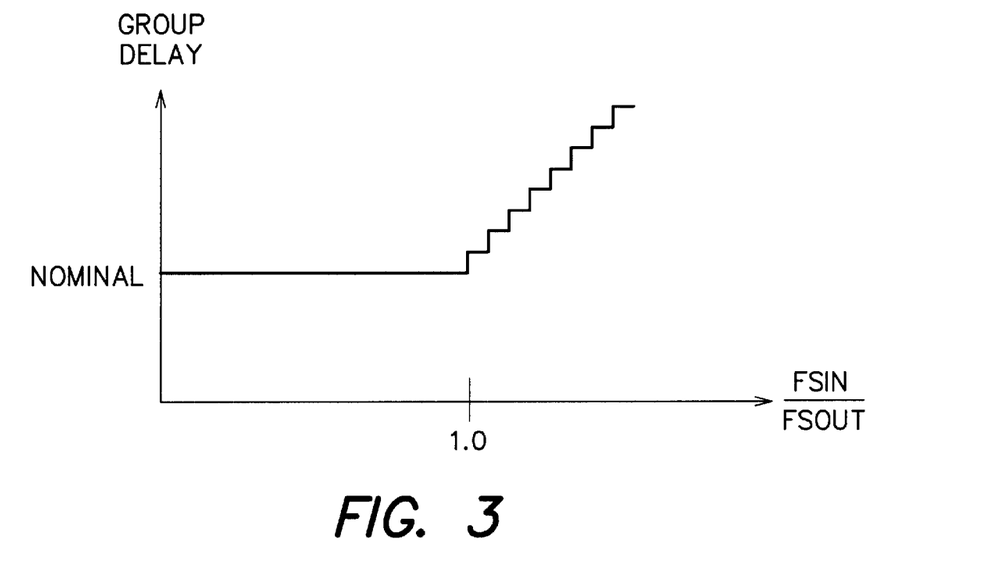
FIG. 3 is a graph of group delay through a sample rate converter as a function of sample rate ratio, wherein the sample rate ratio measurement includes hysteresis.

As noted above, the sample rate ratio circuit 24 preferably incorporates hysteresis such that a change of at least two least significant bits is required before the sample rate ratio value is changed. This prevents a constantly changing sample rate ratio and the accompanying distortion. The group delay through the sample rate converter is plotted as a function of sample rate ratio in FIG. 3 for the case where the sample rate ratio is measured with hysteresis. As shown, the group delay remains constant for sample rate ratio values less than 1.0 and increases in steps for sample rate ratios greater than 1.0.

Figure 4:
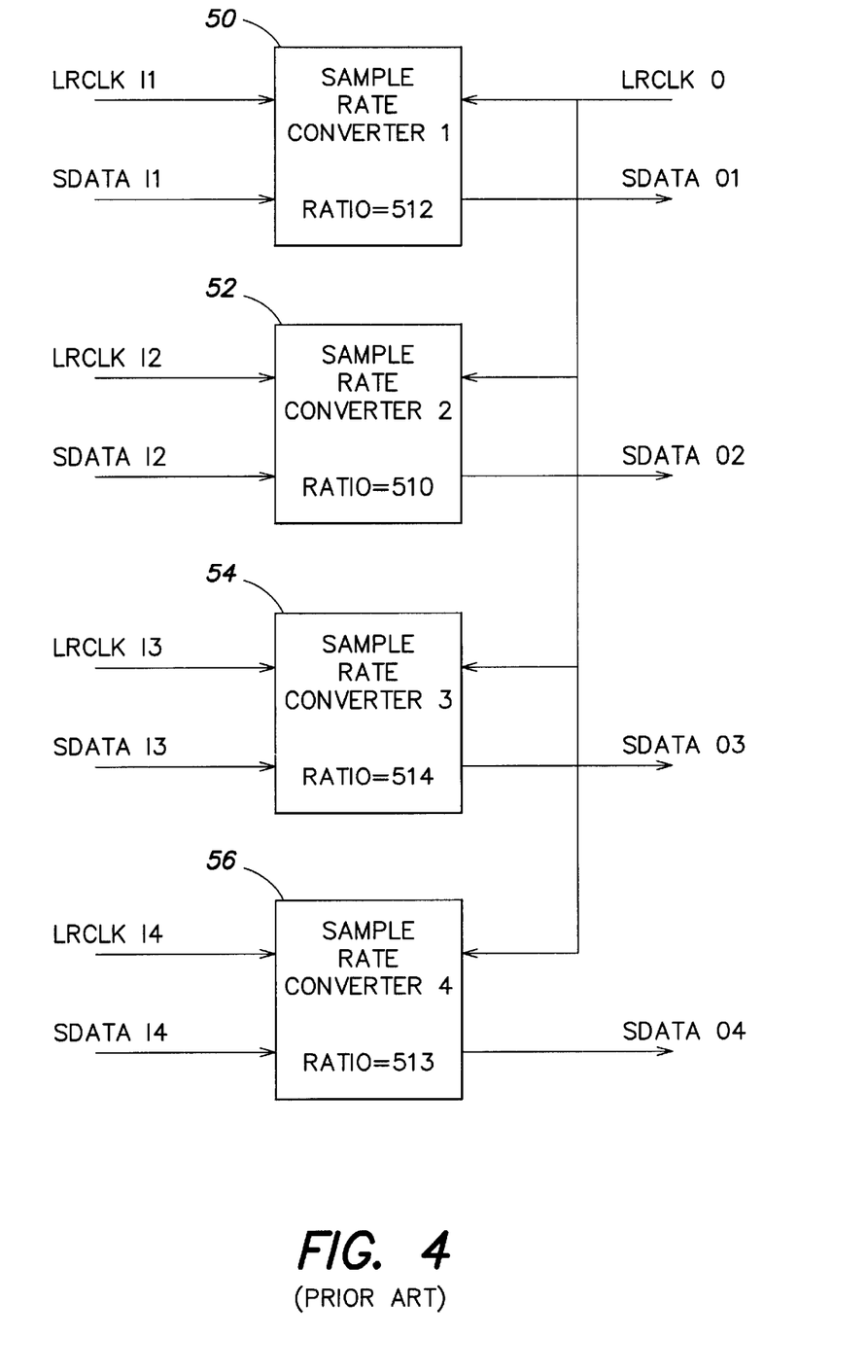
FIG. 4 is a block diagram of a prior art multiple sample rate converter system, wherein different sample rate ratios are measured for a common input clock and a common output clock.

An example of a prior art sample rate conversion system including multiple sample rate converters is shown in FIG. 4. The sample rate conversion system includes sample rate converters 50, 52, 54 and 56 connected in a parallel configuration. A configuration of the type shown in FIG. 4 may be utilized, for example, in transferring the signals from multiple microphones to audio processing equipment or in audio mixing applications. Input clocks LRCLK I1, LRCLK I2, LRCLK I3 and LRCLK I4 are supplied to the input clock lines of sample rate converters 50, 52, 54 and 56, respectively, and an output clock LRCLK O is supplied to the output clock line of each of the sample rate converters. Each of the sample rate converters 50, 52, 54 and 56 measures a sample rate ratio to be used in performing the sample rate conversion as described above. The input clocks have the same or nearly the same frequencies, within the precision of the sample rate ratio measurement. Because the sample rate ratio circuits incorporate hysteresis, different sample rate converters may measure different sample rate ratios. In the example of FIG. 4, sample rate ratios in the range of 510 to 514 are measured by the sample rate converters. Since the group delay through each sample rate converter is a function of sample rate ratio, it is apparent that the sample rate converters 50, 52, 54 and 56 will have different group delays. The different group delays can detract from the fidelity of the audio processing equipment.

In accordance with an aspect of the invention, one of the sample rate converters in a system including two or more sample rate converters is designated as a master. The sample rate ratio, typically the ratio of the input clock sample rate to the output clock sample rate, is measured in the master sample rate converter, and each of the sample rate converters in the system is controlled with the sample rate ratio measured by the master. Accordingly, each sample rate converter may include a sample rate conversion circuit for converting input data at a sample rate of an input clock to output data at a sample rate of an output clock according to a sample rate ratio, a sample rate ratio circuit for measuring the sample rate ratio of the input clock sample rate to the output clock sample rate, and a control circuit for supplying the sample rate ratio to the sample rate conversion circuit. The control circuit supplies the measured sample rate ratio from the sample rate ratio circuit when the sample rate converter is operating as a master and supplies the sample rate ratio received from the master when the sample rate converter is operating as a slave. The measured sample rate ratio is transmitted from the master to each of the slaves.

Figure 5:
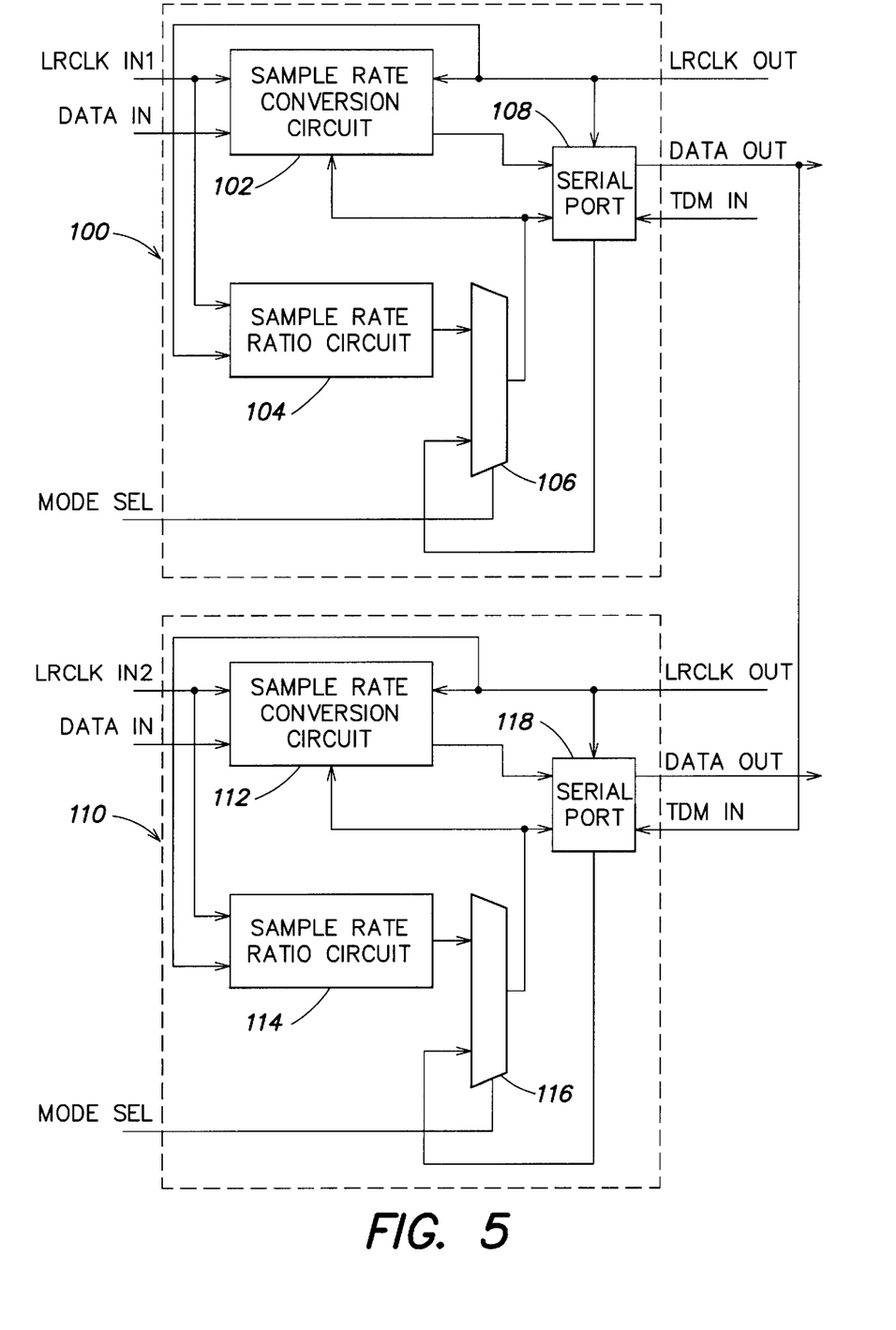
FIG. 5 is a block diagram of a sample rate conversion system in accordance with an embodiment of the invention.

A simplified block diagram of sample rate conversion system in accordance with an embodiment of the invention is shown in FIG. 5. For simplicity, two sample rate converters 100 and 110 are shown. It will be understood that the sample rate conversion system may include more than two sample rate converters. Sample rate converter 100 includes a sample rate conversion circuit 102, a sample rate ratio circuit 104, a control circuit 106 and a serial port 108. Similarly, sample rate converter 110 includes a sample rate conversion circuit 112, a sample rate ratio circuit 114, a control circuit 116 and a serial port 118.

The sample rate conversion circuits 102 and 112 receive input clocks LRCLK IN1 and LRCLK IN2, and an output clock LRCLK OUT. In addition, each sample rate conversion circuit 102, 112 receives serial data in and supplies serial data out. Sample rate conversion circuit 102 receives a sample rate ratio from control circuit 106, and sample rate conversion circuit 112 receives a sample rate ratio from control circuit 116. The sample rate conversion circuits 102 and 112 may include the elements shown in FIG. 1 and described above, with the exception of sample rate ratio circuit 24 (which is shown separately in FIG. 5). Thus, referring to FIG. 1, each of sample rate conversion circuits 102 and 112 includes FIFO 12, FIR filter 14, ROM 16, high order interpolation circuit 18, counter 20 and digital servo loop 22.

Depending on the system configuration, a single input clock or two or more input clocks may be used. In each case, the input clocks have the same or nearly the same frequencies within the measurement precision of sample rate ratio circuits 104 and 114. Furthermore, a single output clock or two or more output clocks may be used. In each case, the output clocks have the same or nearly the same frequencies within the measurement precision of sample rate ratio circuits 104 and 114.

In the embodiment of FIG. 5, control circuit 106 comprises a data selector that receives a first input from sample rate ratio circuit 104 and a second input from serial port 108. Similarly, control circuit 116 comprises a data selector that receives a first input from sample rate ratio circuit 114 and a second input from serial port 118. Each of the control circuits receives a mode select input that determines whether the sample rate converter operates as a master or as a slave. In the example of FIG. 5, sample rate converter 100 is configured to function as a master, and sample rate converter 110 is configured to operate as a slave. The serial ports 108 and 118 each receive a serial input TDM IN. Thus, each control circuit 106 and 116 selects the sample rate ratio from its own sample rate ratio circuit in the master mode and selects the sample rate ratio from an external source in the slave mode.

The sample rate ratio output of control circuit 106 is connected through serial port 108 to the data out line of sample rate converter 100. Similarly, the sample rate ratio output of control circuit 116 is connected through serial port 118 to the data out line of sample rate converter 110. The serial port in the master incorporates the sample rate ratio into the output data frames as described below. The data out line of the sample rate converter designated as the master is connected to the serial input TDM IN of each sample rate converter designated as a slave. One sample rate converter is designated as the master and the remaining sample rate converters are designated as slaves.

In operation, sample rate converter 100 is designated as the master by supplying a mode select signal indicative of the master mode. Sample rate converter 110 is designated as a slave by providing a mode select signal indicative of the slave mode. The input clocks LRCLK IN1 and LRCLK IN2 are supplied to sample rate converters 100 and 110, respectively, and the output clock LRCLK OUT is supplied to sample rate converters 100 and 110. Control circuit 106 selects the sample rate ratio measured by sample rate ratio circuit 104 and supplies the measured sample rate ratio to sample rate conversion circuit 102. In addition, the sample rate ratio measured by sample rate ratio circuit 104 is supplied via the data out line of sample rate converter 100 to the serial input TDM IN of sample rate converter 110. Control circuit 116 selects the external sample rate ratio received on the serial input TDM IN and supplies the external sample rate ratio to sample rate conversion circuit 112. Thus, sample rate converters 100 and 110 both operate with the sample rate ratio measured by sample rate ratio circuit 104. Since the sample rate converters perform sample rate conversion according to a single sample rate ratio measured by sample rate ratio circuit 104 in the master, the sample rate converters 100 and 110 have matched group delays. It will be understood that a sample rate conversion system having multiple sample rate converters operates in the same manner, with the sample rate ratio of all sample rate converters established by the sample rate ratio circuit in the master sample rate converter.

Figure 6:
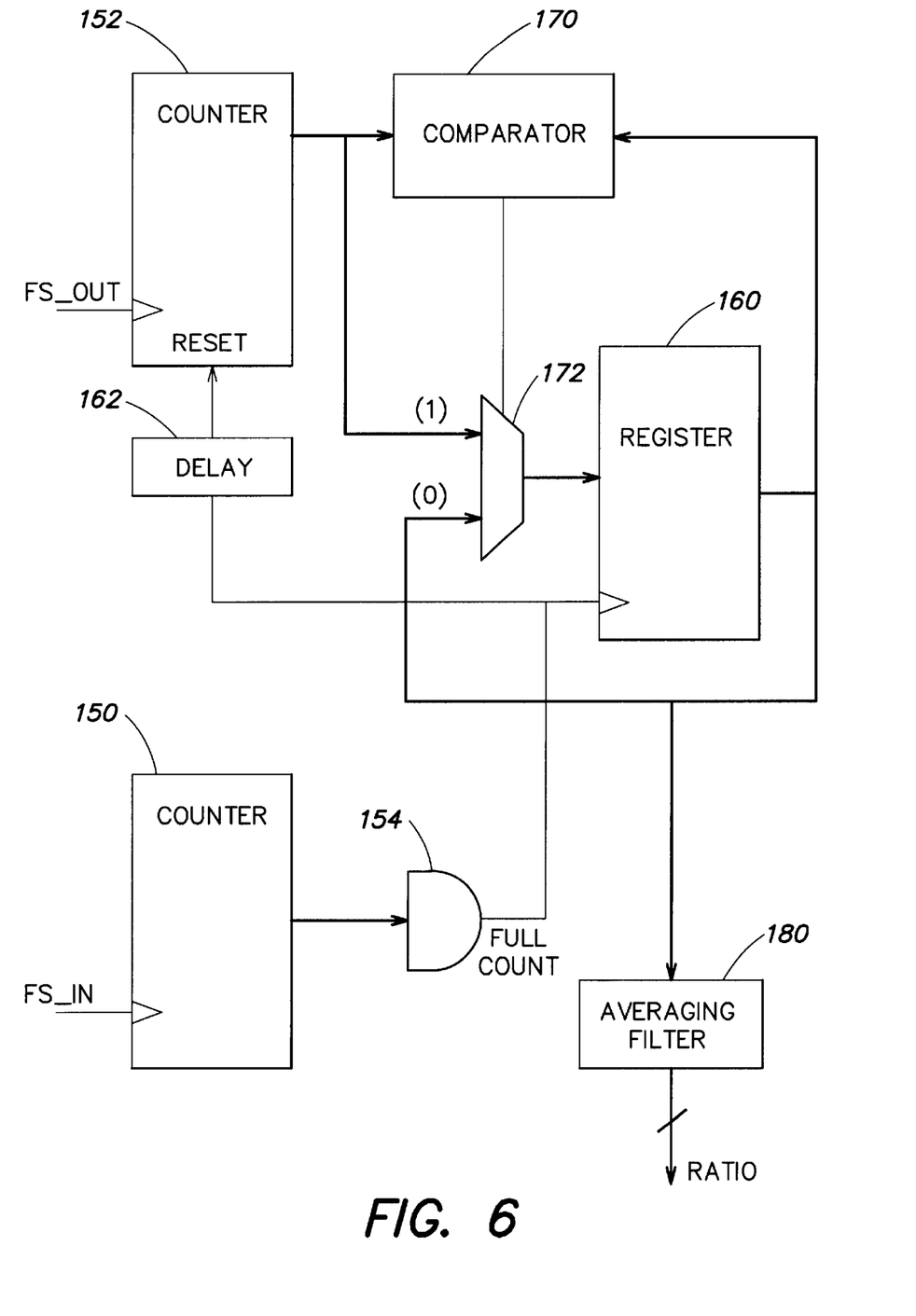
FIG. 6 is a block diagram of an example of a circuit for measuring a sample rate ratio.

An example of a sample rate ratio circuit which may be utilized to implement sample rate ratio circuits 104 and 114 is shown in FIG. 6. The sample rate ratio circuit measures the ratio of the input clock sample rate to the output clock sample rate where the ratio is greater than 1.0. Where the ratio is less than 1.0, the sample rate ratio circuit saturates at 1.0. The input clock LRCLK IN (FS IN), is supplied to a counter 150, and the output LRCLK OUT (FS OUT), clock is supplied to a counter 152. The outputs of counter 150 are supplied to a logic circuit 154 which detects a full count of counter 150. The output of logic circuit 154 is supplied to the load input of a register 160 and is supplied through a delay 162 to the reset input of counter 152. The output of counter 152 is supplied to a first input of a comparator 170 and to a first input of a data selector 172. The output of register 160 is supplied to a second input of comparator 170, to a second input of data selector 172 and to the input of an averaging filter 180. The output of comparator 170 provides a control input to data selector 172. The output of data selector 172 is supplied to register 160. Comparator 170 is configured with hysteresis to avoid oscillation between two sample rate ratio values. Preferably, the sample rate ratio must change by two or more counts of the output clock in order to change the measured value.

In operation, counters 150 and 152 begin counting upon receipt of an enable signal, with counter 150 counting the input clock and counter 152 counting the output clock. During counting, comparator 170 compares the output of counter 152 with the output of register 160, which contains the current value of the sample rate ratio. If the value in counter 152 differs from the current sample rate ratio in register 160 by less than two least significant bits, comparator 170 enables data selector 172 to select the output of register 160, resulting in no change to the measurement of sample rate ratio. If the value in counter 152 differs from the current sample rate ratio in register 160 by two or more least significant bits, comparator 170 enables data selector 172 to select the output of counter 152, thus providing a new measurement of sample rate ratio. The selected value is loaded into register 160 when logic circuit 154 indicates a full count in counter 150. The output of logic circuit 154 also resets counter 152 after delay 162. The updated contents of register 160 thus represent the current measurement of the sample rate ratio. The output of register 160 is supplied through averaging filter 180 as an output of the sample rate ratio circuit. The averaging filter 180 slowly changes the ratio when a new ratio is loaded into register 160 in order to limit audio distortion. As shown in FIG. 5, the output of sample rate ratio circuit 104 is supplied to control circuit 106, and the output of sample rate ratio circuit 114 is supplied to control circuit 116.

Figure 7:
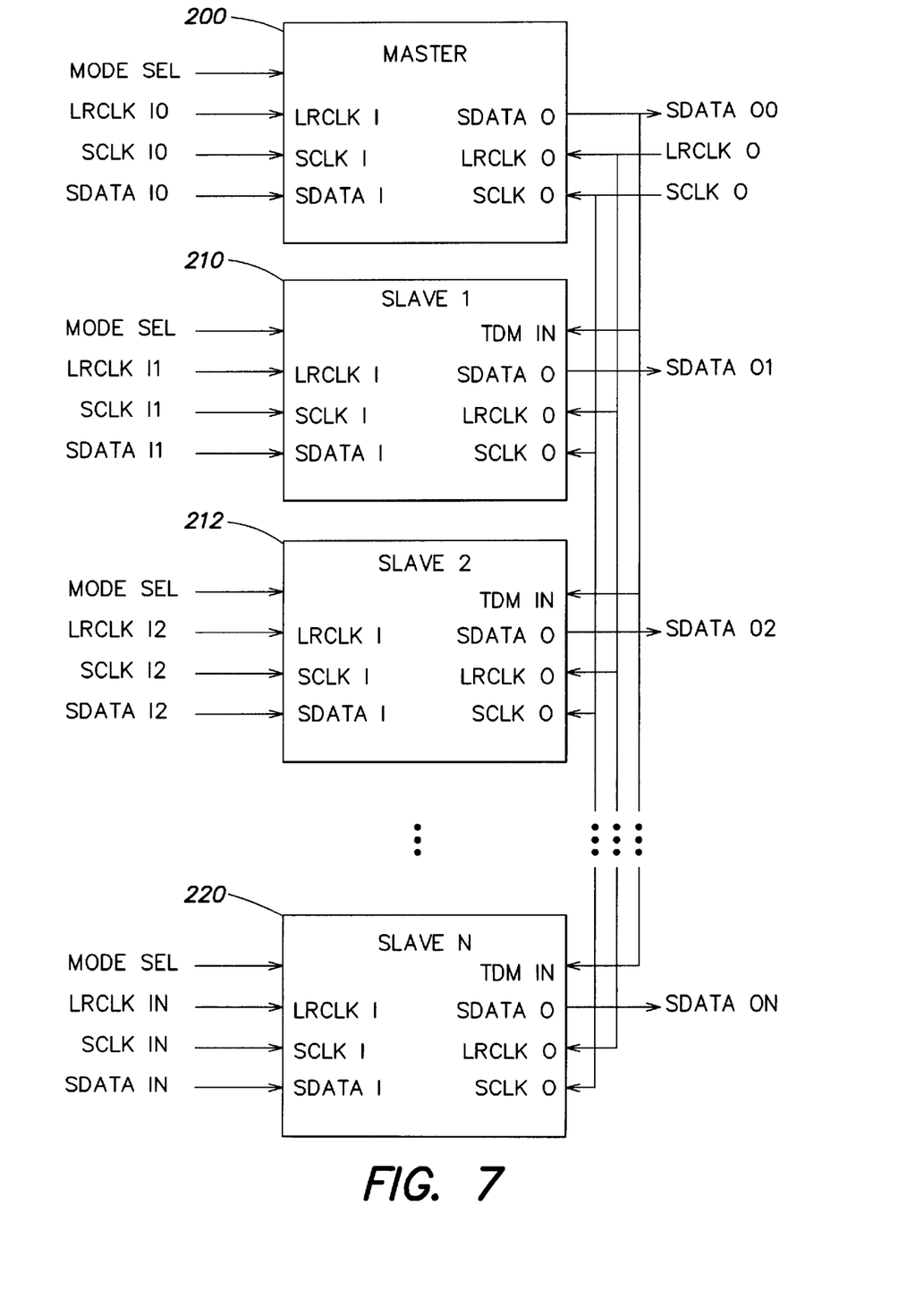
FIG. 7 is a block diagram of a sample rate conversion system, wherein multiple sample rate converters have data lines connected in a parallel configuration.

An embodiment of a sample rate conversion system in accordance with a feature of the invention is shown in FIG. 7. The sample rate conversion system includes a master sample rate converter 200 and slave sample rate converters 210, 212, . . . 220. Each of the sample rate converters 200, 210, 212 . . . 220 receives an input sample clock LRCLK I, an input bit clock SCLK I, an output sample clock LRCLK O and an output bit clock SCLK O. In addition, each of the sample rate converters receives serial input data SDATA I and supplies serial output data SDATA O. The input and output data lines of the individual sample rate converters operate in parallel in the sample rate conversion system of FIG. 7.

Figure 9:
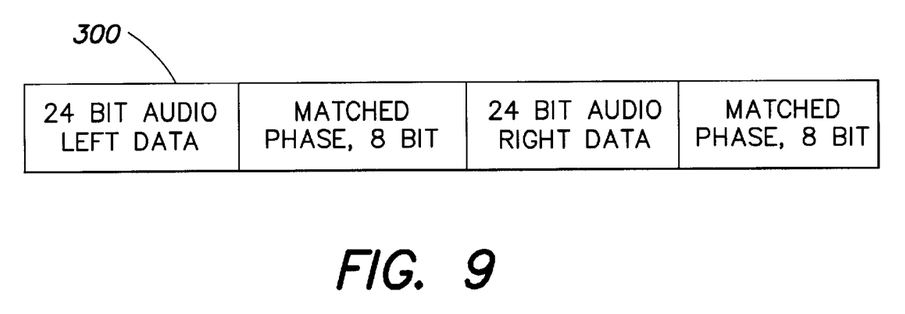
FIG. 9 is a schematic diagram that illustrates a data format used in left justified, $I^2S$ and TDM modes of the sample rate converter.
Figure 10:
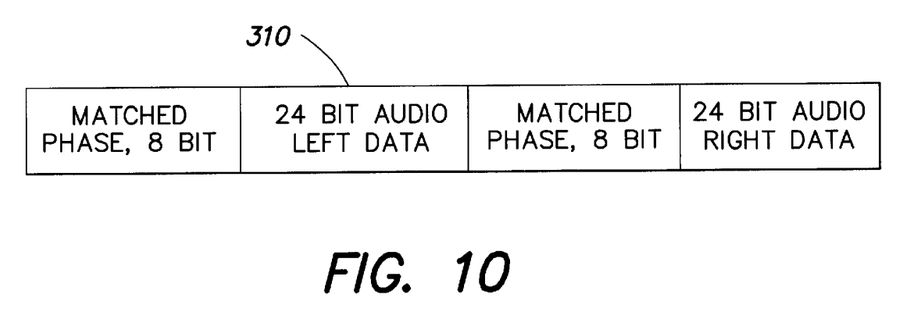
FIG. 10 is a schematic diagram that illustrates a data format used in a right justified mode of the sample rate converter.

The sample rate conversion system of FIG. 7 is configured to provide matched group delays for the output data samples. As shown, each of the sample rate converters receives a mode select input. Sample rate converter 200 is designated as a master, and sample rate converters 210, 212 . . . 220 are designated as slaves. The data output line of master sample rate converter 200 is connected to a serial input TDM IN of slave sample rate converters 210, 212 . . . 220. Thus, the sample rate ratio measured by master sample rate converter 200 is supplied to each of slave sample rate converters 210, 212 . . . 220 as shown in FIG. 5 and described above. Therefore, all the sample rate converters in the sample rate conversion system utilize the sample rate ratio measured by master sample rate converter 200, and matched group delays are ensured. The sample rate conversion system of FIG. 7 may be utilized for three wire serial formats, including left justified, I²S and right justified. These formats are illustrated in FIGS. 9 and 10.

Figure 8:
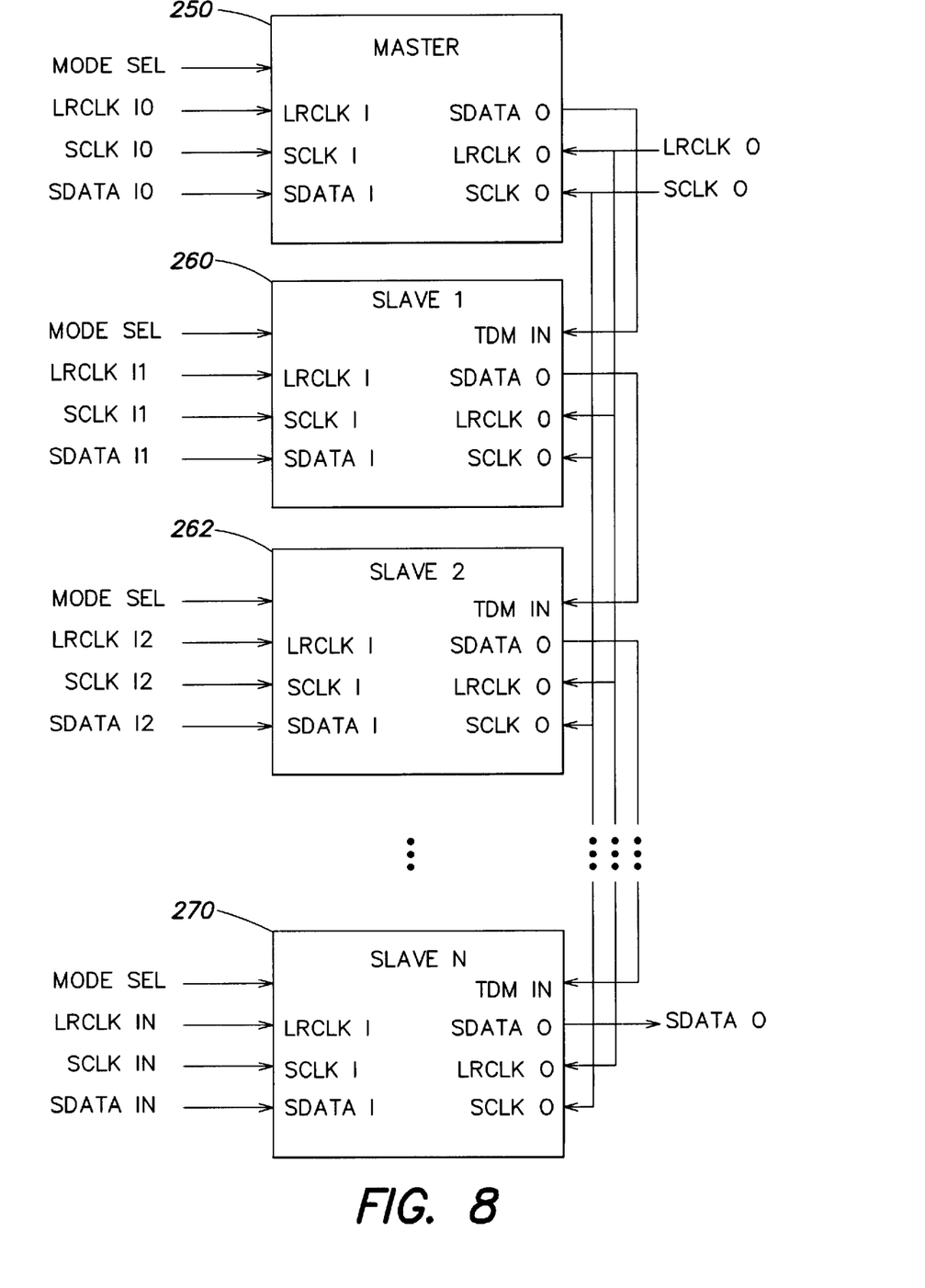
FIG. 8 is a block diagram of a sample rate conversion system, wherein multiple sample rate converters have data lines connected in a daisy chain configuration.

An embodiment of the sample rate conversion system in accordance with another feature of the invention is shown in FIG. 8. The sample rate conversion system includes a master sample rate converter 250 and slave sample rate converters 260, 262, . . . 270. Each of sample rate converters 250, 260, 262 . . . 270 receives an input sample clock LRCLK I, an input bit clock SCLK I, an output sample clock LRCLK O and an output bit clock SCLK O. In addition, each of the sample rate converters receives a serial data input SDATA I. The serial input data lines are connected in parallel, and the serial output data lines are connected in a daisy chain configuration. Thus, the serial data output SDATA O of sample rate converter 250 is connected to a serial data input TDM IN of slave sample rate converter 260, the serial data output SDATA O of sample rate converter 260 is connected to a serial data input TDM IN of sample rate converter 262, etc. The serial data output SDATA O of sample rate converter 270, the last sample rate converter in the chain, is the output of the sample rate conversion system. In the daisy chain configuration, serial data received by each sample rate converter is added onto an output data frame in a time multiplexed fashion.

Sample rate converter 250 receives a mode select input representative of a master, and sample rate converters 260, 262 . . . 270 receive mode select inputs representative of a slave. The master sample rate converter 250 measures the sample rate ratio and provides the measured sample rate ratio on the serial output data line SDATA O to the slave sample rate converters 260, 262 . . . 270 on the serial data inputs TDM IN, as shown in FIG. 5 and described above. Thus, all the sample rate converters in the sample rate conversion system utilize the sample rate ratio measured by master sample rate converter 250, and the group delays of the time multiplexed data outputs are matched.

The data format utilized for transmission of output data samples and sample rate ratio is described with reference to FIGS. 9, 10, 11A and 11B. In the embodiment of FIGS. 9, 10, 11A and 11B, the data is organized in 64-bit frames which contain left and right samples of stereo audio data. The format utilized for left justified, I²S and TDM modes is shown in FIG. 9. A frame 300 includes a 24-bit left channel data sample followed by 8 bits of matched phase information and a 24-bit right channel data sample followed by 8 bits of matched phase information. A frame 310 having the data format for the right justified mode is shown in FIG. 10. The order of the matched phased information and the data samples is reversed with respect to the format of FIG. 9.

Figure 11A:
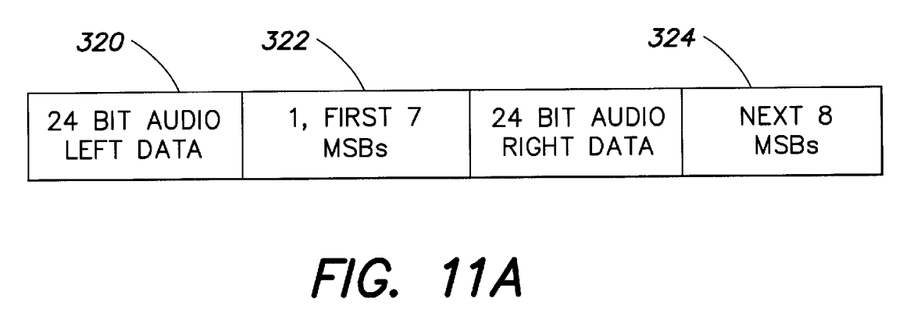
FIGS. 11A and 11B are schematic diagrams that illustrate an example of the data format used to transmit sample rate ratio between sample rate converters.
Figure 11B:
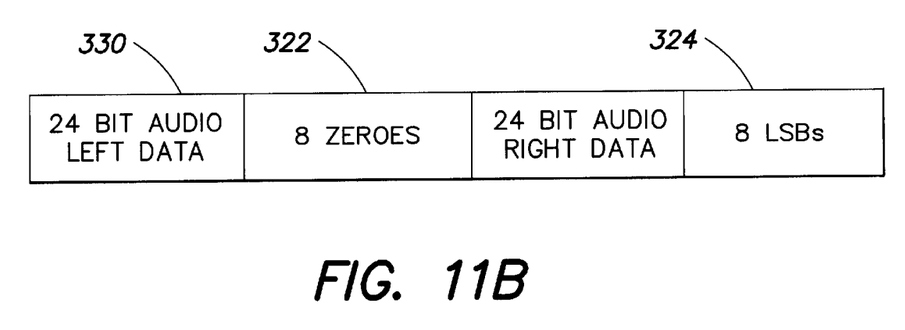

The matched phase mode information, which represents the sample rate ratio, contains 23 bits in one embodiment of the invention. Accordingly, the matched phase mode information is transmitted in two audio data frames, as shown in FIGS. 11A and 11B. A first frame 320, shown in FIG. 11A, contains a data value of 1 and the first 7 most significant bits of the sample rate ratio in a first frame location 322 and the next 8 most significant bits of the sample rate ratio in a second frame location 324. A second frame 330, shown in FIG. 11B, contains 8 zeros in a first frame location 322 and the 8 least significant bits of the sample rate ratio in a second frame location 324. The data value of 1 in the frame location 322 of the first frame and the 8 zero values in the frame location 322 of the second frame permit synchronized transmission of the sample rate ratio between the sample rate converters.

In the embodiments described above, the sample rate ratio is transmitted between sample rate converters by incorporating the sample rate ratio into the serial output data of the sample rate converter. This approach reduces the required number of input/output lines in the sample rate converter, but is not required. It will be understood that separate signal lines may be utilized for transmitting the sample rate ratio between sample rate converters in accordance with the invention.

In the embodiments described above, the sample rate ratio of the input clock to the output clock is measured. In other embodiments, the sample rate ratio of the output clock to the input clock may be measured. In addition, the input clock, the output clock, or both, may be divided in frequency before measurement of the sample rate ratio, within the scope of the invention.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A method for operating two or more sample rate converters, comprising the steps of:
   providing an input clock to each of said sample rate converters;
   providing an output clock to each of said sample rate converters;
   measuring a sample rate ratio of the clocks in one of the sample rate converters, designated as a master; and
   controlling each of said sample rate converters with the sample rate ratio measured by the master.

2. A method as defined in claim 1 further comprising the step of transmitting the measured sample rate ratio from the master to each of the other sample rate converters.

3. A method as defined in claim 2 wherein the step of transmitting the measured sample rate ratio comprises transmitting the measured sample rate ratio on an output data line of the master.

4. A method as defined in claim 1 wherein the step of measuring the sample rate ratio comprises measuring the ratio of the input clock sample rate to the output clock sample rate.

5. A method as defined in claim 1 wherein each of the sample rate converters selects an internal or an external sample rate ratio in response to a mode select input.

6. A method as defined in claim 1 wherein the step of controlling each of said sample rate converters comprises selecting an internal sample rate ratio in response to a master mode input and selecting an external sample rate ratio in response to a slave mode input.

7. A method as defined in claim 1 wherein the step of providing an input clock to each of said sample rate converters comprises providing one input clock to each of said sample rate converters.

8. A method as defined in claim 1 wherein the step of providing an input clock to each of said sample rate converters comprises providing two or more different input clocks to different ones of said sample rate converters, wherein the two or more different input clocks have the same or nearly the same frequencies.

9. A sample rate conversion system comprising:
   a master sample rate converter and one or more slave sample rate converters each adapted for receiving an input clock and an output clock, said master sample rate converter including a sample rate ratio circuit for measuring a sample rate ratio of the clocks; and
   said one or more slave sample rate converters each including a sample rate conversion circuit for sample rate conversion according to the sample rate ratio measured by the master sample rate converter.

10. A sample rate conversion system as defined in claim 9 wherein said sample rate ratio circuit comprises a circuit for measuring the ratio of the input clock sample rate to the output clock sample rate.

11. A sample rate conversion system as defined in claim 9 wherein said master sample rate converter includes a sample rate conversion circuit for converting an input signal at a sample rate of the input clock to an output signal at a sample rate of the output clock according to the sample rate ratio.

12. A sample rate conversion system as defined in claim 9 wherein said master sample rate converter includes a circuit for transmitting the measured sample rate ratio to said one or more slave sample rate converters.

13. A sample rate conversion system as defined in claim 9 wherein said master sample rate converter includes a circuit for transmitting the measured sample rate ratio to said one or more slave sample rate converters on an output data line.

14. A sample rate conversion system as defined in claim 9 wherein said one or more slave sample rate converters each includes a control circuit responsive to a mode select input for selecting the sample rate ratio measured by the master sample rate converter.

15. A sample rate conversion system as defined in claim 9 wherein said master sample rate converter and said one or more slave sample rate converters have data lines connected in a parallel configuration.

16. A sample rate conversion system as defined in claim 9 wherein said master sample rate converter and said one or more slave sample rate converters have data lines connected in a daisy chain configuration.

17. A sample rate conversion system as defined in claim 9 wherein said master sample rate converter and said one or more slave sample rate converters are adapted for receiving one input clock.

18. A sample rate conversion system as defined in claim 9 wherein said master sample rate converter and said one or more slave sample rate converters are adapted for receiving two or more different input clocks, wherein the two or more different input clocks have the same or nearly the same frequencies.

19. A sample rate converter comprising:
   a sample rate conversion circuit for converting an input signal at a sample rate of an input clock to an output signal at a sample rate of an output clock according to a sample rate ratio;
   a sample rate ratio circuit for measuring the sample rate ratio of the clock sample rates; and
   a control circuit for supplying the sample rate ratio measured by the sample rate ratio circuit to the sample rate conversion circuit in a first operating mode and for supplying the sample rate ratio from an external source to the sample rate conversion circuit in a second operating mode.

20. A sample rate converter as defined in claim 19 wherein said sample rate ratio circuit comprises a circuit for measuring the ratio of the input clock sample rate to the output clock sample rate.

21. A sample rate converter as defined in claim 19 further comprising a circuit for transmitting the measured sample rate ratio to another sample rate converter.

22. A sample rate converter as defined in claim 19 further comprising a circuit for transmitting the measured sample rate ratio to another sample rate converter on an output data line.

* * * * *